United States Patent
Toyota et al.

(10) Patent No.: US 7,838,351 B2
(45) Date of Patent: Nov. 23, 2010

(54) THIN FILM TRANSISTOR MANUFACTURING METHOD, THIN FILM TRANSISTOR AND DISPLAY DEVICE USING THE SAME

(75) Inventors: Motohiro Toyota, Kanagawa (JP); Toshiaki Arai, Kanagawa (JP)

(73) Assignee: Sony Corporation, Tokyo (JP)

( * ) Notice: Subject to any disclaimer, the term of this patent is extended or adjusted under 35 U.S.C. 154(b) by 195 days.

(21) Appl. No.: 12/136,825

(22) Filed: Jun. 11, 2008

(65) Prior Publication Data
US 2008/0315199 A1    Dec. 25, 2008

(30) Foreign Application Priority Data
Jun. 20, 2007 (JP) ............................. 2007-162207
Oct. 3, 2007 (JP) ............................. 2007-259502

(51) Int. Cl.
*H01L 21/84* (2006.01)
*H01L 31/00* (2006.01)

(52) U.S. Cl. .................. 438/158; 438/157; 257/57; 257/E33.004; 257/E21.414

(58) Field of Classification Search .............. 438/157, 438/158; 257/57, E21.633, E21.535, E21.704, 257/E21.615, E21.414, E29.273, E33.004
See application file for complete search history.

(56) References Cited

U.S. PATENT DOCUMENTS
6,855,954 B1 * 2/2005 Zhang ....................... 257/59

FOREIGN PATENT DOCUMENTS
| JP | 02-125626 | 5/1990 |
| JP | 06-188422 | 7/1994 |
| JP | 09-298303 | 11/1997 |
| JP | 2915397   | 4/1999 |

* cited by examiner

*Primary Examiner*—Caridad M Everhart
(74) *Attorney, Agent, or Firm*—SNR Denton US LLP (57) ABSTRACT

A thin film transistor manufacturing method includes the steps of: forming a gate electrode, gate insulating film and amorphous silicon film in succession on an insulating substrate; forming a channel protective film only in the region which will serve as a channel region of the amorphous silicon film; and forming an n-plus silicon film and metal layer on top of the channel protective film and amorphous silicon film in succession. The method further includes the step of patterning the amorphous silicon film and n-plus silicon film to selectively leave the region associated with source and drain electrodes, using the channel protective film as an etching stopper to selectively remove the region of the n-plus silicon film and metal layer associated with the channel region so as to form source and drain regions from the n-plus silicon film and also form source and drain electrodes from the metal layer.

6 Claims, 7 Drawing Sheets

THIN FILM TRANSISTOR MANUFACTURING METHOD, THIN FILM TRANSISTOR AND DISPLAY DEVICE USING THE SAME

CROSS REFERENCES TO RELATED APPLICATIONS

The present invention contains subject matter related to Japanese Patent Application JP 2007-162207 filed in the Japan Patent Office on Jun. 20, 2007, and Japan Patent Application JP 2007-259502 filed in the Japan Patent Office on Oct. 3, 2007, the entire contents of which being incorporated herein by reference.

BACKGROUND OF THE INVENTION

1. Field of the Invention

The present invention relates to a thin film transistor manufacturing method, thin film transistor and display device using the same.

2. Description of the Related Art

Recent years have paid attention being focused on a type of flat panel display, namely, a display device adapted to display video using organic EL (electro luminescence). This type of display device or organic EL display offers excellent characteristics including a wide view angle and low power consumption thanks to light emission of the organic light emitting element itself. Further, the organic EL display offers fast response to high-speed high-definition video signals. As a result, development efforts are underway for commercialization particularly in the video and other sectors.

Active matrix, a driving method of the organic EL display in which thin film transistors (TFTs) are used as driving elements, is superior to conventional passive matrix in terms of response time and resolution. Thus, this driving method is considered to be particularly suited to the organic EL display having the aforementioned characteristics. An active matrix organic EL display includes at least organic light-emitting elements (organic EL elements) having a light-emitting material and a drive panel having TFTs adapted to drive the organic light-emitting elements. This drive panel and a sealing panel are bonded together via an adhesive layer with organic EL elements sandwiched therebetween. Further, the active matrix organic EL display includes at least a switching transistor and drive transistor as TFTs making up the organic EL display. The switching transistor controls the pixel contrast. The drive transistor controls the light emission of the organic EL elements.

In such an organic EL display, controlling the gate voltage of the drive transistor regulates the current flowing into the organic EL element, thus controlling the display gray level. As a result, if the current flowing through the drive transistor differs significantly from one pixel to another, the light emission brightness of the display differs from one pixel to another. That is, the light emission of the organic EL element depends on the current flowing through the drive transistor. Suppression of the variation in the drive transistor current in an organic EL display is, therefore, extremely important to display an excellent image.

One factor behind the variation in TFT current is the variation in a "length L" of the TFT. Here, the term "length L of the TFT" refers to the source-to-drain distance of the TFT. That is, the finished source-to-drain distance of the channel etching stopper is the length L. Therefore, if this source-to-drain distance varies significantly across the finished surface, the ON current, which is one of the TFT characteristics, will vary accordingly.

Incidentally, the presence or absence of the variation in the length L of the TFT is known to depend upon the accuracy of forming a channel protective film. The channel protective film serves as an etching stopper during the formation of the source and drain. That is, the channel protective film is typically formed by first forming a resist pattern on top of a film formed with an insulating material and then masking and etching the resist pattern. In the etching process, however, if the etching rate varies, the source-to-drain distance in the TFT will accordingly vary.

A possible solution to the above problem would be to reduce the variation by means of self-aligned exposure and development using backside exposure from the gate electrode. However, this solution may not complement the variation in etching rate in the etching process. As a result, a problem remains to be solved: that is, the variation in etching rate will lead to the variation in length L of the TFT.

A possible solution to reduce the variation in etching shift during formation of the channel protective film, on the other hand, would be selective dry etching of the channel protective film formed on top of the silicon film by means of anisotropic dry etching. However, even anisotropic etching damages the resist pattern serving as a mask during etching of the channel protective film due to anisotropic ion collisions. As a result, the resist pattern itself may recede to reflect the variation in anisotropic dry etching. Therefore, even anisotropic dry etching fails to avoid the problem of the variation in finished source-to-drain distance.

On the other hand, it is difficult to achieve an approximately infinite selectivity to the silicon, for example, in the etching process using hydrogen fluoride solution. Instead, the [stopper etch rate/silicon damage rate] is at most 2 to 10. Therefore, if the channel protective film serving as a stopper is dry-etched through its entire thickness in one stroke, overetching is necessary which is appropriate for the variation in time resulting from etching through the entire film thickness. This results in more time occupied for overetching, possibly requiring the silicon film to be thicker. Further, if the channel protective film on the channel region is etched to the silicon for patterning with hydrogen fluoride solution, this solution may possibly find its way through pin holes of the silicon film, thus etching the gate insulating film. This may lead to reduced interlayer insulation capability of the gate insulating film.

Japanese Patent No. 2915397 discloses a hybrid layered structure of an insulating film serving as an etching stopper. This structure suppresses overhanging of the taper portion caused by etching with hydrogen fluoride solution, thus preventing transistor leakage. However, in the wet etching or isotropic etching of both layers to the silicon surface, the stopper insulating film being etched plays, in the middle of the wet etching process, the role of a mask for the remaining stopper insulating film, irrespective of the type of layered structure of the etching stopper. Therefore, dimensional variation resulting from isotropic etching variation is inevitable.

Japanese Patent Laid-Open No. Hei 9-298303 discloses a layered structure of the channel protective film. This structure suppresses damage to the gate insulating film caused by penetration of hydrofluoric acid through pin holes during dry etching. The structure also provides, for example, reduced etching damage to the silicon. However, during etching of the bottom layer of the layered structure after etching of the top layer thereof and removal of the resist, the top layer itself is used as a mask. As a result, the top layer's size at the completion of etching is transferred as the length L in an as-is manner. This leads to a variation in the length L because of etching variation of the top layer.

Japanese Patent Laid-Open No. Hei 6-188422 discloses a layered structure of the channel protective film. In the process following the formation of the same film (etching process of the n-plus layer), the top layer has a lower etching rate than the bottom layer so as to provide a reduced variation in remaining thickness of the channel protective film. This provides a reduced variation in transistor characteristics. However, the term "variation in transistor characteristics" as used herein is not related to the variation in the length L resulting from etching of the channel protective film itself. As a result, the problem caused by the variation in the length L remains to be solved.

SUMMARY OF THE INVENTION

The present invention has been made in light of the aforementioned problem inherent in the related art, and it is desirable to provide a thin film transistor or TFT manufacturing method which can suppress the variation in a length L of the TFT without increasing the silicon film thickness more than necessary and thereby form a TFT with a small characteristic variation. It is also desirable to provide a TFT and display device using the same.

There is a need for the present embodiment to provide a TFT manufacturing method. The TFT manufacturing method includes the steps of: forming a gate electrode, gate insulating film and amorphous silicon film in succession on an insulating substrate; forming a channel protective film in the region which will serve as a channel region of the amorphous silicon film; and forming an n-plus silicon film and metal layer on top of the channel protective film and amorphous silicon film in succession. The method further includes the step of patterning the amorphous silicon film and n-plus silicon film to selectively leave the region associated with source and drain electrodes. Then, the third step uses the channel protective film as an etching stopper to selectively remove the region of the n-plus silicon film and metal layer associated with the channel region, thus forming source and drain regions from the n-plus silicon film and also forming source and drain electrodes from the metal layer. The step of forming the channel protective film forms the same film so that the film has a layered structure made up of a plurality of layers having different etching rates and so that the lowermost layer of the layered structure has selectivity to reset the etching variation of the layers other than the lowermost layer.

According to the TFT manufacturing method having the aforementioned steps, the channel protective film has a layered structure made up of a plurality of layers having different etching rates, and the lowermost layer of the layered structure has selectivity to reset the etching variation. As a result, in the etching of the channel protective film, the layers other than the lowermost layer can be etched, for example, by an etching method which leads to a small dimension shift. The lowermost layer, in the meantime, can be etched by an anisotropic dry etching method with a small isotropic etching component. This makes it possible to form a TFT in such a manner that the variation in the length L, as finished, from the resist mask size is suppressed without increasing the amorphous silicon film thickness more than necessary. As a result, a transistor can be formed which offers a smaller characteristic variation as compared to the related art. Further, the layer immediately on top of the amorphous silicon film can be etched by dry etching without using hydrogen fluoride solution which is a chemical etchant. This prevents potential risks of reduced interlayer insulation capability of the gate insulating film resulting from the erroneous etching of the same film by the hydrogen fluoride solution which has found its way through pin holes.

A method according to an embodiment of the present invention can suppress the variation in a length L of the TFT without increasing the amorphous silicon film thickness more than necessary, thus allowing for formation of TFTs with a small characteristic variation. As a result, a display device including such TFTs offers a reduced variation in pixel-by-pixel light emission brightness and other characteristics thanks to a small characteristic variation of the TFTs. This eventually contributes to excellent image quality of the display device.

DETAILED DESCRIPTION OF THE PREFERRED EMBODIMENT

A description will be given below of the thin film transistor manufacturing method, thin film transistor and display device using the same according to the present invention based on the accompanying drawings.

First, the display device will be described taking, as an example, an organic EL display operable to cause an organic EL element to emit light using a TFT as a drive element.

Figure 1:
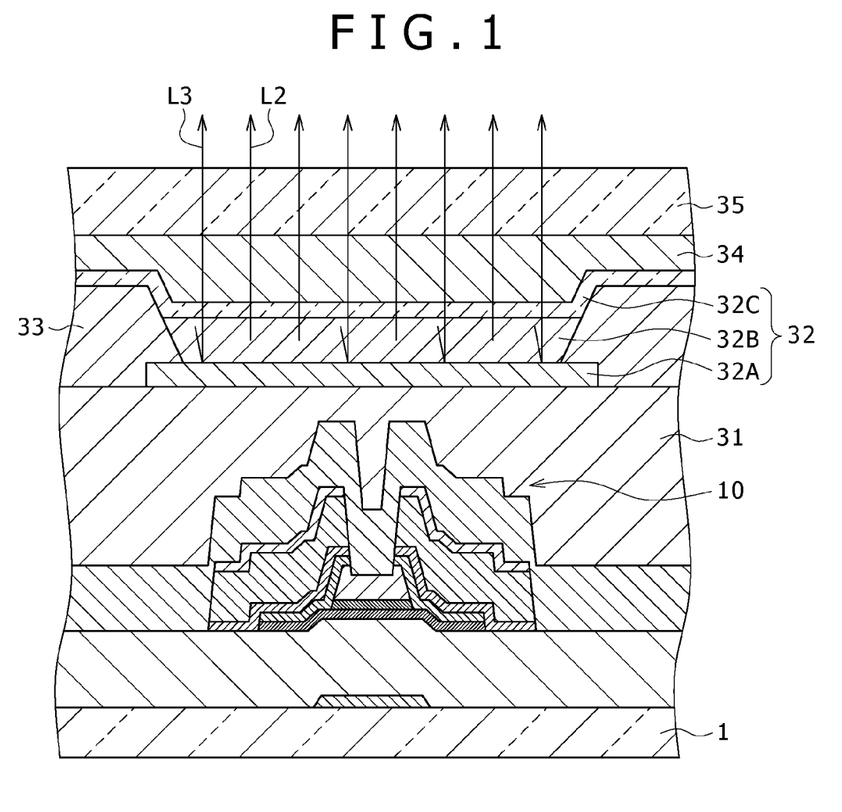
FIG. 1 is an explanatory view illustrating a configuration example of an organic EL display including TFTs.

FIG. 1 is an explanatory view illustrating a configuration example of an organic EL display including TFTs.

The organic EL display illustrated in the figure has a TFT 10 formed as a drive element on an insulating substrate 1. Further, an insulating planarizing film 31 is formed uniformly on top of the TFT 10. Still further, a plurality of organic EL elements 32 are formed. Each of the organic EL elements 32 includes a reflective electrode 32A, organic light emitting layer 32B and transparent electrode 32C. Still further, an interelectrode insulating film 33 is formed to separate the organic EL elements 32 one from the other. Another insulating planarizing film 34 is formed on top of the interelectrode insulating film 33. Finally, a light permeable substrate 35 is formed to sandwich the aforementioned films, elements and layers between itself and the insulating substrate 1. If a predetermined voltage is applied between the reflective electrode 32A and transparent electrode 32C in the organic EL display configured as described above, the organic light emitting layer 32B will emit light, projecting emitted light beams L2 and L3 upward.

It should be noted that although a so-called top emission organic EL display has been described herein, a bottom emission or dual emission organic EL display may be alternatively used.

Figure 2A:
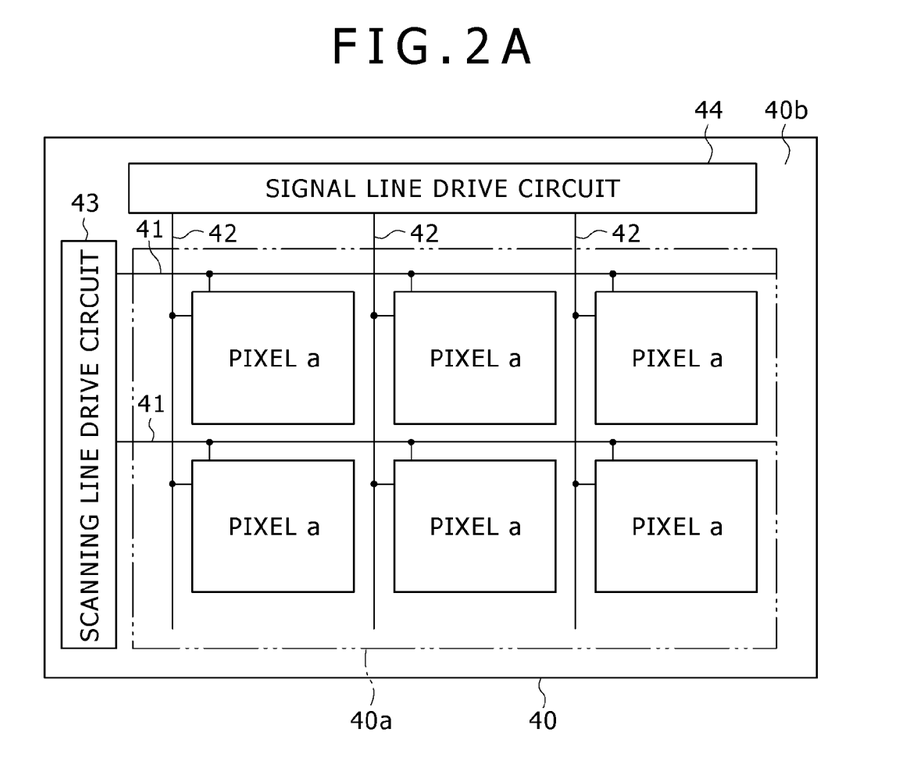
FIGS. 2A and 2B are explanatory views illustrating an example of pixel circuit configuration of the organic EL display.
Figure 2B:
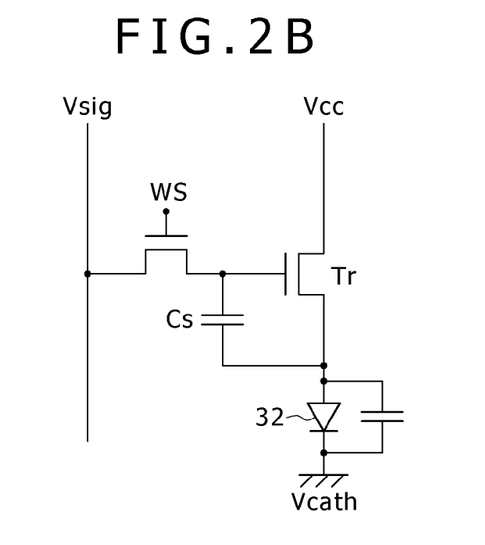

FIGS. 2A and 2B are explanatory views illustrating an example of pixel circuit configuration of the organic EL display. Here, an active matrix organic EL display is taken as an example which uses organic EL elements as drive elements.

As illustrated in FIG. 2A, a display region 40a and peripheral region 40b are provided on a substrate 40 of the organic EL display. The display region 40a has a plurality of scanning lines 41 arranged horizontally and a plurality of signal lines 42 arranged vertically. A pixel 'a' is disposed at each of the intersections between the scanning lines 41 and signal lines 42 to form a pixel array section. Each of the pixels 'a' has an organic EL element. The peripheral region 40b has a scanning line drive circuit 43 and signal line drive circuit 44. The scanning line drive circuit 43 scans and drives the scanning lines 41. The signal line drive circuit 44 supplies a video signal (namely, input signal) to the signal lines 42 in accordance with brightness information.

We assume that the display region 40a has a mixture of organic EL elements for different color components or R, G and B to display a full-color image, and that the organic EL elements are arranged in a matrix pattern according to a predetermined rule. The number of organic EL elements disposed and the area occupied by the same elements may be equal for different color components. Alternatively, the number and area may be different for different color components according to the energy component for each color component.

As illustrated in FIG. 2B, the pixel circuit in each of the pixels 'a' includes, for example, the organic EL element 32, a drive transistor Tr, writable transistor (sampling transistor) WS and holding capacitance Cs. As the scanning line 41 is driven by the scanning line drive circuit 43, a video signal written from the signal line 42 via the write transistor WS is held by the holding capacitance Cs. The current commensurate with the level of the signal held by the capacitance Cs is supplied to the organic EL element 32. The organic EL element 32 emits light at the brightness commensurate with the amount of current.

It should be noted that the aforementioned pixel circuit configuration is merely an example. A capacitive element may be added as necessary. Further, the pixel circuit may include a plurality of transistors. Still further, necessary drive circuits are added in the peripheral region 40b according to changes made to the pixel circuit.

Such an organic EL display controls the gate voltage of the drive transistor Tr, thus controlling the amount of current flowing into the organic EL element 32 and regulating the display gray level. If the current flowing through the drive transistor differs significantly from one pixel to another, the light emission brightness of the display differs from one pixel to another. That is, the light emission of the organic EL element 32 depends upon the amount of current flowing through the drive transistor Tr. Suppression of the variation in the drive transistor current in an organic EL display is, therefore, extremely important to display an excellent image.

Display devices typified by the above-described organic EL display are finding application as display devices of electronic equipment of all sectors for displaying an image or video of the video signal fed to or generated in the electronic equipment. Specific examples of electronic equipment having a display device will be described below.

It should be noted that display devices include those having a sealed configuration in modular form. For example, one among such display devices is a display module formed by attaching an opposed section, made of transparent glass or other material, to the pixel array section. The transparent opposed section may have a color filter, protective film, and additionally a light-shielding film described above. Further, the display module may have a circuit section adapted to permit exchange of signals between external equipment and the pixel array section. The display module may also have an FPC (flexible printed circuit).

Figure 3:
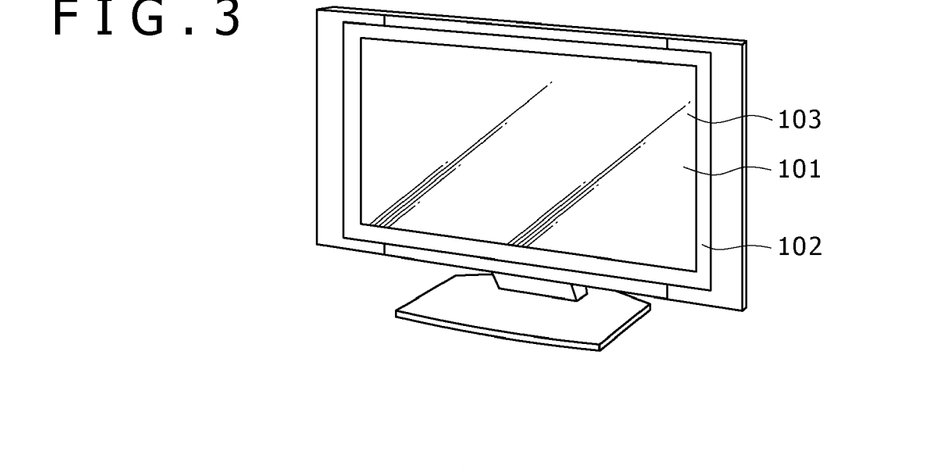
FIG. 3 is a perspective view illustrating a television set which is a specific example of electronic equipment.

FIG. 3 is a perspective view illustrating a television set which is a specific example of electronic equipment. The television set illustrated in the figure includes a video display screen section 101. The same section 101 includes a front panel 102, filter glass 103 and other components. The television set is manufactured by using a display device as the video display screen section 101.

Figure 4A:
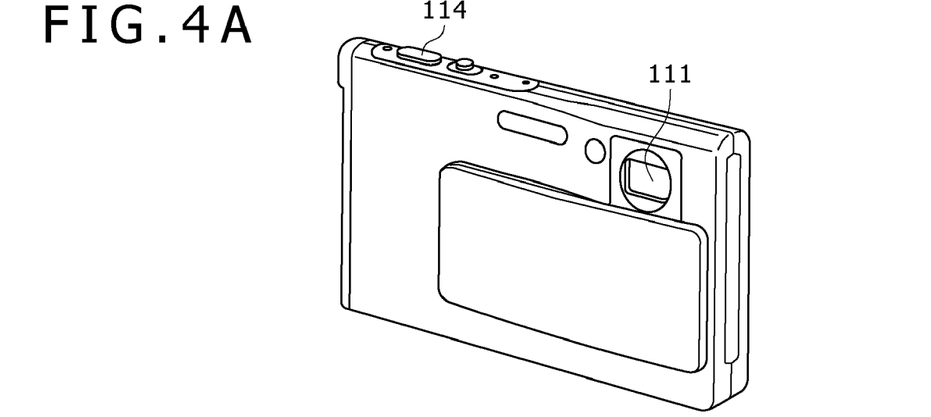
FIGS. 4A and 4B are perspective views illustrating a digital camera which is a specific example of electronic equipment.
Figure 4B:
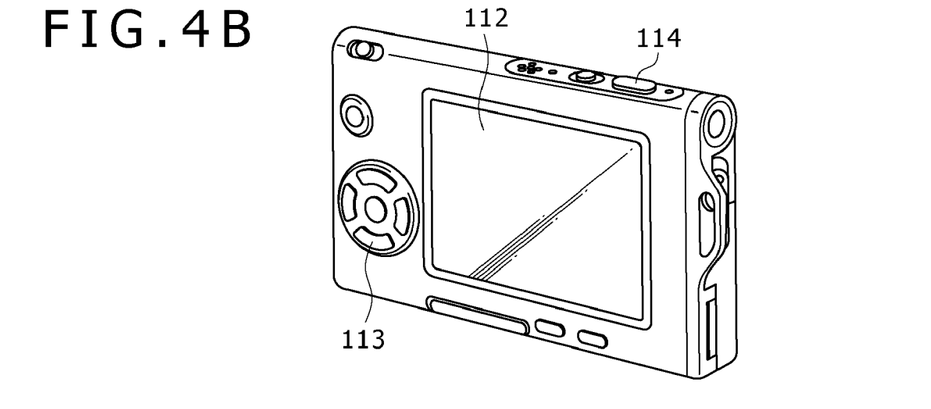

FIGS. 4A and 4B are perspective views illustrating a digital camera which is a specific example of electronic equipment. FIG. 4A is a perspective view as seen from the front. FIG. 4B is a perspective view as seen from the rear. The digital camera illustrated in the figures includes a light-emitting section 111 for flash, display section 112, menu switches 113, shutter button 114 and other components. The digital camera is manufactured by using a display device as the display section 112.

Figure 5:
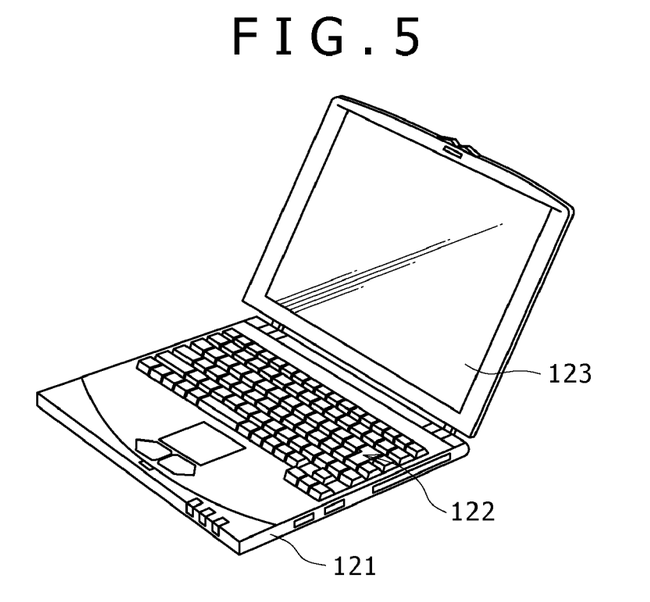
FIG. 5 is a perspective view illustrating a laptop personal computer which is a specific example of electronic equipment.

FIG. 5 is a perspective view illustrating a laptop personal computer which is a specific example of electronic equipment. The laptop personal computer illustrated in the figure includes a main body 121, keyboard 122 adapted to be operated for entry of text and other information, display section 123 for image display and other components. The laptop personal computer is manufactured by using a display device as the display section 123.

Figure 6:
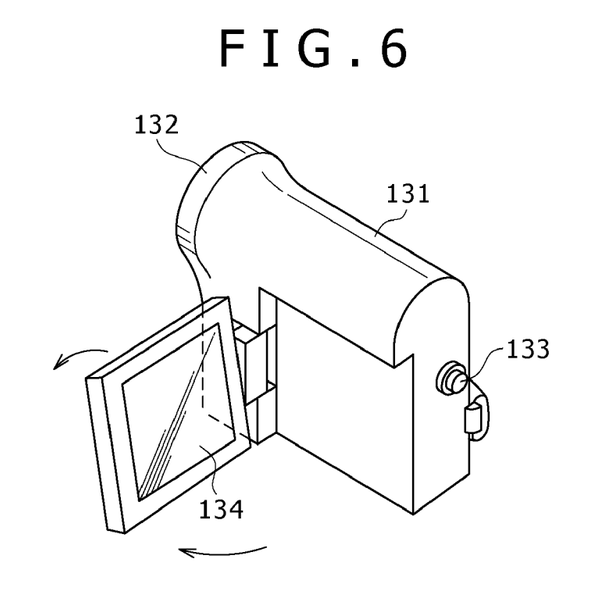
FIG. 6 is a perspective view illustrating a video camcorder which is a specific example of electronic equipment.

FIG. 6 is a perspective view illustrating a video camcorder which is a specific example of electronic equipment. The video camcorder illustrated in the figure includes a main body section 131, lens 132, imaging start/stop switch 133, display section 134 and other components. The front-facing lens 132 is adapted to image the subject and disposed on the side of the video camcorder. The video camcorder is manufactured by using a display device as the display section 134.

Figure 7A:
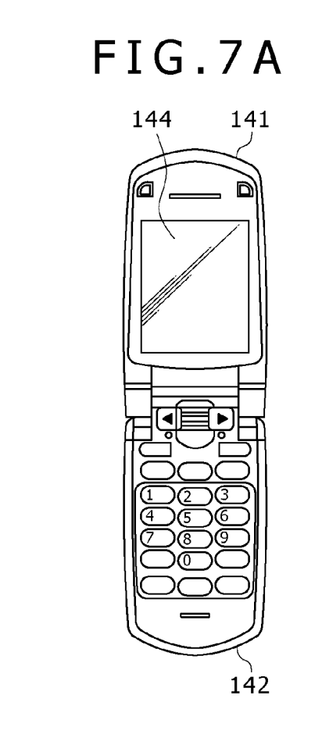
FIGS. 7A to 7G are views illustrating a portable terminal device such as mobile phone which is a specific example of electronic equipment.
Figure 7B:
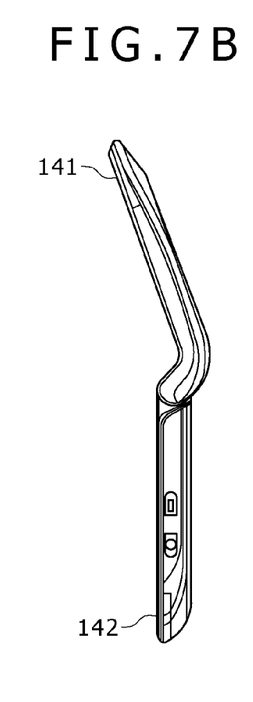
Figure 7C:
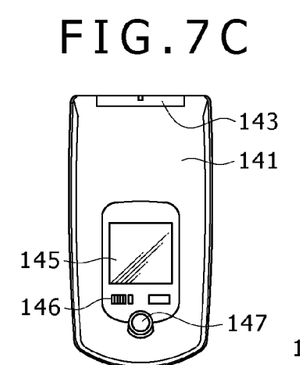
Figure 7D:
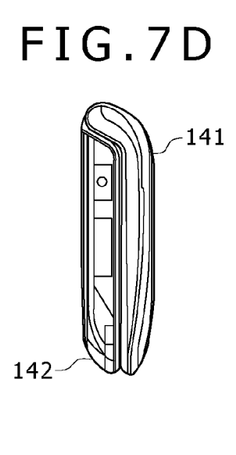
Figure 7E:
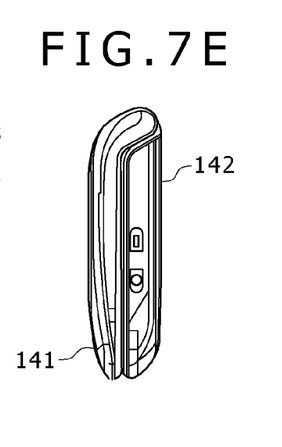
Figure 7F:
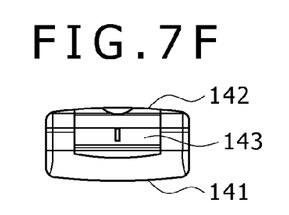
Figure 7G:
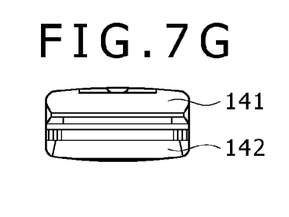

FIGS. 7A to 7G are views illustrating a portable terminal device such as mobile phone which is a specific example of electronic equipment. FIG. 7A is a front view of the mobile phone as opened. FIG. 7B is a side view thereof. FIG. 7C is a front view of the mobile phone as closed. FIG. 7D is a left side view thereof. FIG. 7E is a right side view thereof. FIG. 7F is a top view thereof. FIG. 7G is a bottom view thereof. The mobile phone according to the present application example includes an upper enclosure 141, lower enclosure 142, connecting section (hinge section in this example) 143, display 144, subdisplay 145, picture light 146, camera 147 and other components. The mobile phone is manufactured by using display devices as the display 144 and subdisplay 145.

A description will be given in more detail of the TFT 10 which is used as a drive element in the organic EL display configured as described above.

FIGS. 8A to 8D are explanatory views illustrating the outline of TFT manufacturing steps.

Figure 8A:
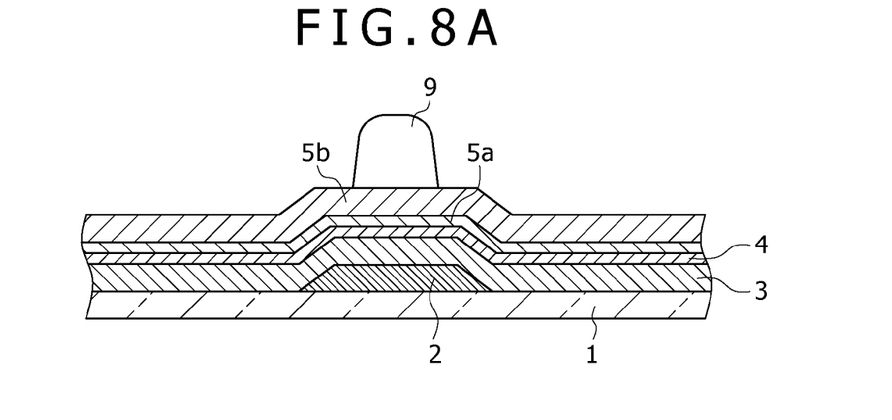
FIGS. 8A to 8D are explanatory views illustrating the outline of TFT manufacturing steps to which an embodiment of the present invention is applied.

In the manufacturing of the TFT 10, a molybdenum (Mo) film of about 100 nm in thickness is formed uniformly on top of the insulating substrate 1 including a glass or plastic material first by sputtering as illustrated in FIG. 8A. Then, the molybdenum film is etched by photolithography for patterning into a predetermined shape, thus forming a gate electrode 2. In addition to Mo, other metals such as chromium (Cr) and titanium (Ti) may be used to form the gate electrode 2 so long as the metal has a high enough melting point to be resistant to deterioration under heat resulting from crystallization of an amorphous silicon film 4 in a later process.

Following the formation of the gate electrode 2, a silicon oxide film ($SiO_2$) of about 160 nm in thickness is formed uniformly on top of the insulating substrate 1 and the gate electrode 2 by plasma CVD, thus forming a gate insulating film 3. It should be noted that the gate insulating film 3 does not necessarily include $SiO_2$. Instead, the same film 3 may include an insulating material made up, for example, of one or a plurality of three materials, namely, $SiO_2$, silicon nitride (SiN) and silicon oxide nitride (SiON).

Further, an amorphous silicon film 4 of about 30 nm in thickness is formed on top of the gate insulating film 3, for example, by plasma CVD.

Following the formation of the amorphous silicon film 4, dehydrogenating annealing is performed as a pre-annealing process, for example, in a nitrogen atmosphere furnace at 430° C. After this pre-annealing process, the amorphous silicon film 4 is irradiated with excimer laser beam ($\lambda=308$ nm) for crystallizing annealing. The laser beam used for this laser annealing process is not necessarily be excimer laser or pulsed wave laser, and may instead be a continuous wave solid-state laser.

In the laser annealing process, a silicon nitride, silicon oxide or other film may be formed on top of the amorphous silicon film 4 as an anti-reflection film, for example, by CVD so as to ensure high efficiency in the crystallization of silicon. In this case, the anti-reflection film on the amorphous silicon film 4 may be used as a bottom etching stopper layer of the channel protective film rather than being removed following the laser annealing process.

The wavelength used for the laser annealing process is not necessarily one in the silicon absorption band such as excimer laser beam ($\lambda=308$ nm). Instead, a wavelength of $\lambda=800$ nm, for example, may be used for the annealing process if a silicon oxide, silicon nitride or other film is formed on top of the silicon as a buffer layer adapted to prevent impurity diffusion (impurity diffusion prevention layer) and if an Mo or other film is formed as a photo-thermal conversion layer via the buffer layer. Also in this case, the photo-thermal conversion layer may be used as the bottom etching stopper layer of the channel protective film rather than being removed following the laser annealing process. Alternatively, the photo-thermal conversion layer may be removed, but not the buffer layer for use as a bottom etching stopper layer.

It should be noted that if crystallization is not necessary or if necessary crystallization is achieved in the film forming step (in the CVD chamber), the aforementioned dehydrogenating annealing or laser annealing is not necessarily required. In this case, etching stopper films 5a and 5b may be continuously formed during formation of the gate insulating film 3 and silicon film 4 by plasma CVD. The etching stopper films 5a and 5b will be described later.

Following the reforming of the amorphous silicon film 4 by the annealing process, the bottom etching stopper film 5a (hereinafter simply referred to as the "bottom film") and top etching stopper film 5b (hereinafter simply referred to as the "top film") are formed on top of the amorphous silicon film 4 to form the channel protective film. More specifically, for example, a silicon oxide film of about 20 nm in thickness is formed as the bottom film 5a, and a silicon nitride film of about 300 nm in thickness formed as the top film 5b by plasma CVD so that the two films are stacked one on top of another. It should be noted that silicon oxide nitride films may be used as the bottom and top films 5a and 5b rather than silicon oxide or nitride films so long as these films function properly as etching stoppers. Alternatively, the bottom and top films 5a and 5b may have a layered structure made up of a silicon oxide film, silicon nitride film or silicon oxide nitride film and other type of film.

However, the bottom and top films 5a and 5b are different in etching rate from each other. More specifically, the two films have etching rates and thicknesses which meet the conditions given later.

Following the formation of the bottom and top films 5a and 5b formed as described above, a resist mask 9 is formed by photolithography at positions associated with the location where the channel protective film is formed.

Figure 8B:
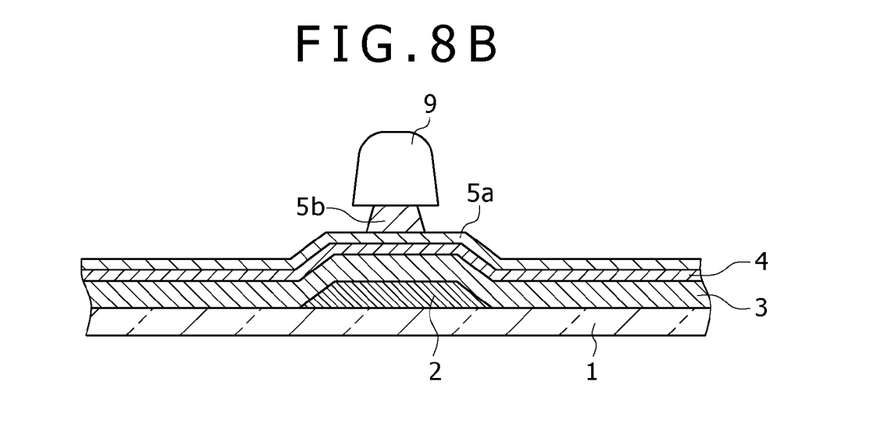
Figure 8C:
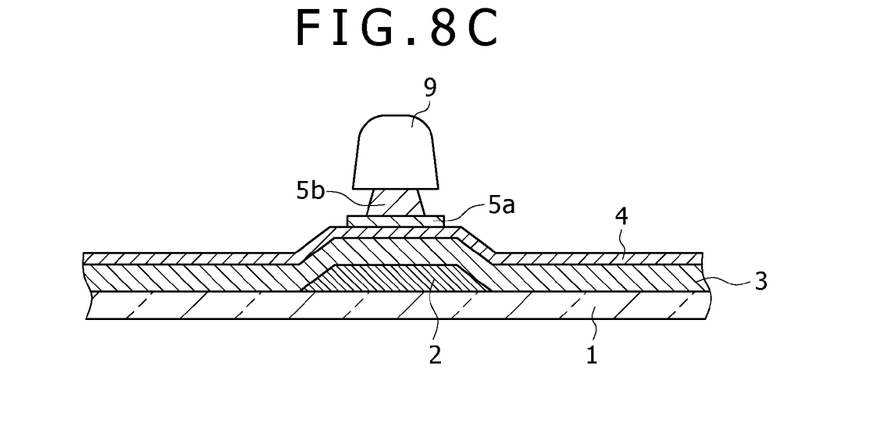

Then, the layered structure made up of the bottom and top films 5a and 5b is etched as illustrated in FIGS. 8B and 8C to form a channel protective film in the region which will serve as the channel region of the amorphous silicon film 4. It should be noted, however, that the etching process at this time is conducted separately in a plurality of steps. More specifically, the etching process is conducted in two steps, namely, the first step adapted to etch the top film 5b (refer to FIG. 8B) and the second step adapted to etch the bottom film 5a (refer to FIG. 8C).

The first etching step (hereinafter simply referred to as the "first etch") uses an etching technique which leads to a small dimension shift. As techniques leading to a small dimension shift, for example, there are etching using hydrogen fluoride solution (wet etching), dry etching in a mode dominated by isotropic etching with small resist damage (PE mode dry etching) and etching using plasma reactive species (CDE: Chemical Dry Etching)

It should be noted that the first etch should have sufficient selectivity to the bottom film 5a (ratio in etching speed of the material to be removed to the mask material). In this respect, sufficient selectivity can be ensured, for example, by providing a difference in closeness between the bottom and top films 5a and 5b. This difference can be provided by controlling the parameters such as power, electrode-to-electrode gap, pressure and material gas mixing ratio. Alternatively, a silicon oxide film may be used as the bottom film 5a, and a silicon nitride film as the top film 5b. As a result, a selectivity of about 8 to the silicon oxide film can be provided by chemical dry etching involving addition of nitrogen to a fluorocarbon-based gas. In this case, the above selectivity can be provided without any constraints in terms of closeness of the films.

The second etching step (hereinafter simply referred to as the "second etch") uses an etching technique with a small isotropic etching component. One among such etching techniques with a small isotropic etching component is anisotropic dry etching. More specifically, an example of such a technique is anisotropic dry etching conducted in anisotropic dry etch mode and in RIE mode which allows for selective etching of the silicon. This anisotropic dry etching is conducted under the gas-plasma conditions involving addition of hydrogen to a fluorocarbon-based gas or to the SF6 gas.

It should be noted that if dry etching (in a mode dominated by isotropic etching) is performed as the first etch, the second etch may be performed in the same dry etching device in succession without breaking a vacuum with the etch mode switched to a mode dominated by anisotropic etching.

Incidentally, in the etching process involving a plurality of etching steps made up of the first and second etches, the thicknesses of the bottom and top films 5a and 5b and the etching rates of the first and second etches are set so that the relationships given below are satisfied.

That is, the thickness of the top film 5b is denoted by Bt (nm), the thickness of the bottom film 5a by At (nm) and the film thickness of the region serving as the channel region of the amorphous silicon film 4 by Sit (nm). Further, the etching rate of the top film 5b and variation thereof in the first etch is denoted by Bs1 (nm/min)±Bu1 (%) and the etching rate of the bottom film 5a and variation thereof in the first etch by As1 (nm/min)±Au1 (%). Still further, the etching rate of the top film 5b and variation thereof in the second etch is denoted by Bs2 (nm/min)±Bu2 (%), the etching rate of the bottom film 5a and variation thereof in the second etch by Sis2 (nm/min) ±Siu2 (%), and the etching rate of the amorphous silicon film 4 and variation thereof in the second etch by As2 (nm/min) ±Au2 (%). In this case, the thicknesses of the bottom and top films 5a and 5b and amorphous silicon film 4 and the conditions (e.g., techniques and parameters) of the first and second etches are set so that the following relationships, namely, $Bs1 > As1, As2 > Sis2,$ $At > [2 \times Bs1 \times Bu1 \times Bt \times As1 \times (100 + Au1)]/[Bs1 \times Bs1 \times (100 - Bu1)(100 + Bu1)]$ and $Sit > [At \times Sis2 \times (100 + Siu2)]/[As2 \times (100 - Au2)]$, are satisfied.

By satisfying the above relationships, the etching of the top film 5b is complete before the bottom film 5a disappears by the etching as illustrated in FIG. 8B while at the same time suppressing damage causing a dimension shift from the resist mask 9 (etching damage causing dimension shift). Moreover, even in the event of a variation in the size of the top film 5b after the etching thereof, damage causing a dimension shift from the resist mask 9 is suppressed. Therefore, the second etch of the bottom film 5a using the same resist mask 9 will accommodate the variation in the size of the top film 5b.

In the following second etch, the bottom film 5a on top of the amorphous silicon film 4 undergoes anisotropic selective dry etching as illustrated in FIG. 8C. Following this etching step, the size of the resist mask 9 which remains undamaged by the first etch is transferred in an as-is manner onto the bottom film 5a. As a result, the bottom film 5a offers finished size whose variation is suppressed. Further, etching variation of the top film 5b can be accommodated.

Still further, the second etch needs to etch the thickness of the bottom film 5a. Therefore, the film thickness margin, required according to the etching selectivity to the silicon, is small.

Still further, the second etch does without hydrogen fluoride solution, which is a chemical etchant, during dry etching of the bottom film 5a immediately on top of the amorphous silicon film 4. This eliminates potential risks of reduced interlayer insulation capability of the gate insulating film 3 resulting from erroneous etching of the same film 3 by hydrogen fluoride solution which has found its way through pin holes.

Here, we assume that the etching rate of the top film 5b and variation thereof and the etching rate of the bottom film 5a and variation thereof in the first etch are set to be 80 (nm/min) ±10(%) and 10 (nm/min)±10(%) respectively, and that the etching rate of the bottom film 5a and variation thereof and the etching rate of the amorphous silicon film 4 and variation thereof in the second etch are set to be 40 (nm/min)±10(%) and 5 (nm/min)±10(%) respectively. Assuming that the top film 5b is 300 nm thick, then if the bottom film 5a is 8.3 nm or more and the amorphous silicon film 4 is 1.3 nm or more, the dimensions of the resist mask 9 will be transferred in an as-is manner to form a channel protective film with a minimal variation without losing any of the bottom film 5a or amorphous silicon film 4.

It should be noted that the thickness of 1.3 nm or more of the amorphous silicon film 4 corresponds to the minimal thickness which can prevent complete loss of the same film 4. Practically, therefore, the amorphous silicon film 4 preferably has a thickness which includes the minimal thickness required in the contact layer region (e.g., 10 nm). More specifically, the same film 4 should probably be about 30 nm thick.

Figure 8D:
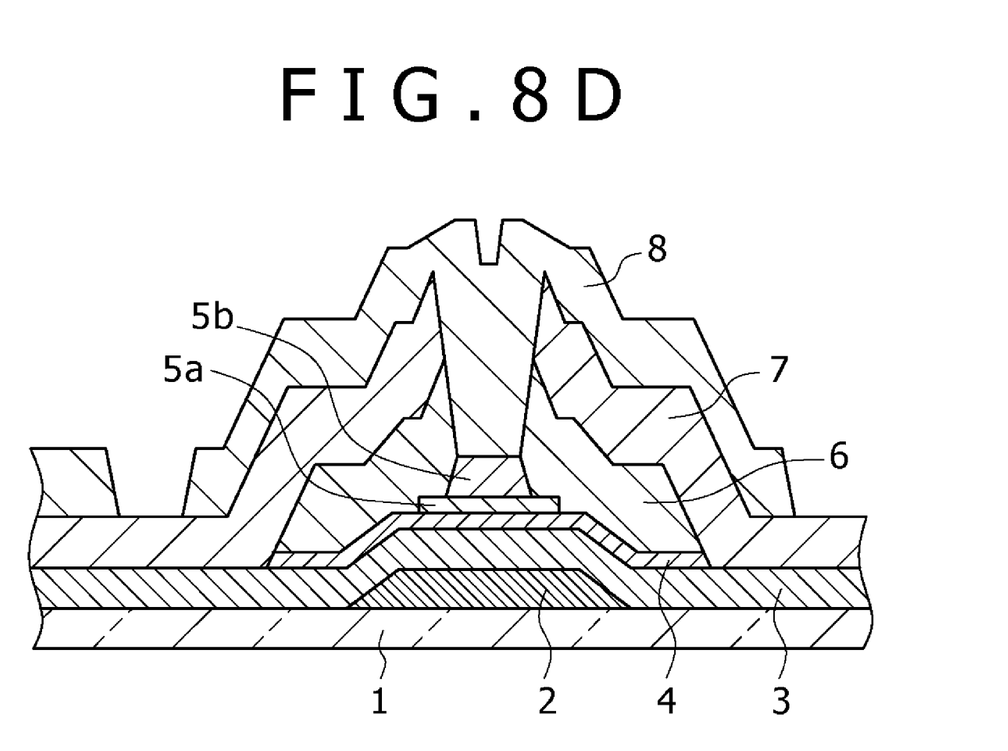

As described above, following the formation of a channel protective film having a layered structure made up of the bottom and top films 5a and 5b, an n-plus amorphous silicon film 6 of about 50 nm in thickness is formed on top of top of the channel protective film and amorphous silicon film 4 as illustrated in FIG. 8D. Then, the amorphous silicon film 4 and n-plus amorphous silicon film 6 are patterned into an island-shaped pattern to selectively leave the region associated with the source and drain electrodes (namely, the region associated with the gate electrode 2). Further, a metal layer 7 is formed. The same layer 7 has a three-layer structure made up of a titanium layer of about 50 nm in thickness, aluminum layer of about 250 nm in thickness and another titanium layer of about 50 nm in thickness. Finally, etching is conducted using the channel protective film as an etching stopper to selectively remove the regions of the n-plus amorphous silicon film 6 and metal layer 7 associated with the channel region. This forms source and drain regions from the n-plus amorphous silicon film 6 and source and drain electrodes from the metal layer 7.

Following this step, a passivation film 8 of about 300 nm in thickness is formed. The same film 8 includes a silicon nitride film. Then, the contact hole portions are patterned.

Thus, the TFT 10 is manufactured by the steps described above.

The manufacturing method of the TFT 10 having the aforementioned steps and the TFT 10 obtained as a result of the manufacturing method offer a layered structure made up of the bottom and top films 5a and 5b having different etching rates. The bottom film 5a which corresponds to the lowermost layer of the layered structure has selectivity to reset the etching variation of the top film 5b which is the other layer of the layered structure. In the etching process adapted to form a channel protective film, the first etch of the top film 5b uses an etching technique which leads to a small dimension shift from the resist mask to suppress the erosion of the resist mask 9. The second etch of the bottom film 5a uses an anisotropic dry etching technique with a small isotropic etching component. This makes it possible to form the TFT 10 in such a manner that the variation in the length L, as finished, from the resist mask size is suppressed without increasing the amorphous silicon film thickness more than necessary. As a result, the TFT 10 can be formed which has a smaller characteristic variation as compared to the related art. Further, the layer immediately on top of the amorphous silicon film 4 is etched by dry etching without using hydrogen fluoride solution which is a chemical etchant. This prevents potential risks of reduced interlayer insulation capability of the gate insulating film 3 resulting from the erroneous etching of the same film 3 by the hydrogen fluoride solution which has found its way through pin holes.

That is, the channel protective film serving as a channel etching stopper has a layered structure made up of the bottom and top films 5a and 5b having different etching rates. The top film 5b is etched in such a manner that the resist is eroded to a small extent. The bottom film 5a has selectivity to reset the etching variation of the top film 5b. Further, the bottom film 5a is subjected to anisotropic dry etching for selective removal to suppress the variation in the length L of the TFT 10. This allows for formation of the TFT 10 with a small characteristic variation.

This is extremely effective particularly when using a device such as organic EL display in which the amount of current flowing through the transistor determines the brightness. The reason for this is that the reduction of the variation in current is important in such a device. For a large-screen display in particular, the transistor using the channel protective film as an etching stopper is effective. In this case, however, increasing the uniformity in the vertical direction of the channel protective film (uniformity along the thickness) alone is not enough. Unless uniformity in the channel direction (plane direction) is secured, it is difficult to keep the current variation, for example, to 10% or less. In contrast, if the TFT 10 is configured as described herein, uniformity in the channel direction (variation in the length L) can be significantly improved as compared to the related art. As a result, the TFT 10 will prove extremely effective in achieving brightness uniformity in a large-size organic EL display.

As described above, the TFT 10 and manufacturing method thereof described herein can suppress the variation in the length L without increasing the thickness of the amorphous silicon film 4 more than necessary. This makes it possible to form the TFT 10 with a small characteristic variation. Therefore, an organic EL display including the TFT 10 can suppress the variation in light emission brightness between different pixels thanks to a small characteristic variation of the TFT 10. This eventually contributes to excellent image quality of the organic EL display.

Although a preferred embodiment has been described hereinabove, the present invention is not limited thereto but may be modified as appropriate without departing from the spirit of the invention.

For example, a case has been described above in which the channel protective film has a two-layered structure made up of the bottom and top films 5a and 5b. However, the same film having a three- or more-layered structure can provide the same advantages as with the present embodiment so long as the lowermost layer has selectivity to reset the etching variation.

On the other hand, the materials, film thicknesses and film forming methods and conditions of the elements cited herein as an example are not particularly limited to the above but may be modified as necessary.

The present invention is applicable not only to an organic EL display as described above but also, for example, to a liquid crystal display device including liquid crystal elements as display elements. Also in this application, the present invention provides the same advantages as described herein.

What is claimed is:

1. A thin film transistor manufacturing method comprising the steps of:
    forming a gate electrode, gate insulating film and amorphous silicon film in succession on an insulating substrate;
    forming a channel protective film in a region which will serve as a channel region of the amorphous silicon film;
    forming an n+ silicon film and metal layer on top of the channel protective film and amorphous silicon film in succession; and
    patterning the amorphous silicon film and n+ silicon film to selectively leave a region associated with source and drain electrodes, and using the channel protective film as an etching stopper to selectively remove the region of the n+ silicon film and metal layer associated with the channel region so as to form source and drain regions from the n+ silicon film and also form source and drain electrodes from the metal layer, wherein,
    the channel protective film is formed so that the channel protective film has a layered structure made up of a plurality of layers having different etching rates and so that a bottom layer of the layered structure has selectivity to reset the topological etching variation of an upper layer of the layered structure such that the bottom layer is patterned differently than the upper layer.

2. A thin film transistor manufacturing method comprising the steps of:
    forming a gate electrode, gate insulating film and amorphous silicon film in succession on an insulating substrate;
    forming a channel protective film in a region which will serve as a channel region of the amorphous silicon film;
    forming an n+ silicon film and metal layer on top of the channel protective film and amorphous silicon film in succession; and
    patterning the amorphous silicon film and n+ silicon film to selectively leave a region associated with source and drain electrodes, and using the channel protective film as an etching stopper to selectively remove the region of the n+ silicon film and metal layer associated with the channel region so as to form source and drain regions from the n+ silicon film and also form source and drain electrodes from the metal layer,
    wherein,
    the channel protective film is formed so that the channel protective film has a layered structure made up of a plurality of layers having different etching rates and so that a bottom layer of the layered structure has selectivity to reset the etching variation of an upper layer, and
    the process of forming the channel protective film includes a plurality of etching steps, the plurality of etching steps comprising:
        a first etching step adapted to form the upper layer using an etching technique which leads to a small dimension shift from the resist, and
        a second etching step adapted to form the bottom layer using an etching technique with a small isotropic etching component.

3. The thin film transistor manufacturing method of claim 2, wherein when the thickness of the upper layer is denoted by Bt, the thickness of the bottom layer by At, the film thickness of the region serving as the channel region of the amorphous silicon film by Sit, the etching rate of the upper layer and variation thereof in the first etching step by $Bs1 \pm Bu1$, the etching rate of the bottom layer and variation thereof in the first etching step by $As1 \pm Au1$, the etching rate of the upper layer and variation thereof in the second etching step by $Bs2 \pm Bu2$, the etching rate of the lowermost bottom layer and variation thereof in the second etching step by $Sis2 \pm Siu2$, and the etching rate of the amorphous silicon film and variation thereof in the second etching step by As2±Au2, the following relationships, namely, Bs1>As1, As2>Sis2, At>[2×Bs1×Bu1×Bt×As1×(100+Au1)]/[Bs1×Bs1×(100−Bu1)(100+Bu1)] and Sit>[At×Sis2×(100+Siu2)]/[As2×(100−Au2)], are satisfied.

4. A thin film transistor manufacturing method comprising the steps of:

forming a gate electrode, gate insulating film and amorphous silicon film in succession on an insulating substrate;

forming a channel protective film in a region which will serve as a channel region of the amorphous silicon film;

forming an n+ silicon film and metal layer on top of the channel protective film and amorphous silicon film in succession;

forming an anti-reflection film or impurity diffusion prevention layer on top of the amorphous silicon film and forming a photo-thermal conversion layer on top of the anti-reflection film or impurity diffusion prevention layer; and irradiating an optical beam onto the anti-reflection film, impurity diffusion prevention layer or photo-thermal conversion layer to heat the amorphous silicon film so as to crystallize the amorphous silicon film and form a crystalline silicon film, patterning the amorphous silicon film and n+ silicon film to selectively leave a region associated with source and drain electrodes, and using the channel protective film as an etching stopper to selectively remove the region of the n+ silicon film and metal layer associated with the channel region so as to form source and drain regions from the n+ silicon film and also form source and drain electrodes from the metal layer, wherein, the channel protective film is formed so that the channel protective film has a layered structure made up of a plurality of layers having different etching rates and so that a bottom layer of the layered structure has selectivity to reset the etching variation of an upper layer, and the anti-reflection film or impurity diffusion prevention layer is used as the bottom layer of the channel protective film rather than being removed following the heating.

5. A thin film transistor comprising:

a gate electrode and gate insulating film formed on top of an insulating substrate;

an amorphous silicon film formed on top of the insulating substrate via the gate electrode and gate insulating film, the amorphous silicon film having a channel region in a region associated with the gate electrode;

an insulating channel protective film selectively formed in a region associated with the channel region on top of the crystalline silicon film;

an n+ silicon film having source and drain regions on top of the channel protective film and amorphous silicon film with the region associated with the channel region sandwiched therebetween; and a metal layer having source and drain electrodes respectively on top of the source and drain regions, wherein the channel protective film has a layered structure made up of a plurality of layers having different etching rates, and a bottom layer of the layered structure has selectivity to reset the topological etching variation of an upper layer of the layered structure such that the bottom layer is patterned differently than the upper layer.

6. A display device comprising:

a plurality of display elements; and a thin film transistor adapted to drive the plurality of display elements in a predetermined manner, wherein the thin film transistor includes a gate electrode and gate insulating film formed on top of an insulating substrate, an amorphous silicon film formed on top of the insulating substrate via the gate electrode and gate insulating film, the amorphous silicon film having a channel region in a region associated with the gate electrode, an insulating channel protective film selectively formed in a region associated with the channel region on top of the crystalline silicon film, an n+ silicon film having source and drain regions on top of the channel protective film and amorphous silicon film with the region associated with the channel region sandwiched therebetween, a metal layer having source and drain electrodes respectively on top of the source and drain regions, the channel protective film has a layered structure made up of a plurality of layers having different etching rates, and a bottom layer of the layered structure has selectivity to reset the topological etching variation of an upper layer of the layered structure such that the bottom layer is patterned differently than the upper layer.

* * * * *